(12) United States Patent
White et al.

(10) Patent No.: US 12,319,999 B2
(45) Date of Patent: Jun. 3, 2025

(54) REFILLABLE LARGE VOLUME SOLID PRECURSOR SUBLIMATION VESSEL

(71) Applicant: Applied Materials, Inc., Santa Clara, CA (US)

(72) Inventors: Carl Louis White, Gilbert, AZ (US); Mohith Eipe Verghese, Phoenix, AZ (US); David Thomas Marquardt, Scottsdale, AZ (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 461 days.

(21) Appl. No.: 17/093,518

(22) Filed: Nov. 9, 2020

(65) Prior Publication Data

US 2022/0145456 A1 May 12, 2022

(51) Int. Cl.
*C23C 16/448* (2006.01)
(52) U.S. Cl.
CPC ............... *C23C 16/4481* (2013.01)
(58) Field of Classification Search
CPC .......... C23C 16/4481; C23C 16/45561; C23C 14/243; C23C 14/246
USPC ....................................... 118/726
See application file for complete search history.

(56) References Cited

U.S. PATENT DOCUMENTS

| | | |
|---|---|---|
| 7,122,085 B2 | 10/2006 | Shero et al. |
| 7,971,861 B2 | 7/2011 | Soininen |
| 8,137,462 B2 | 3/2012 | Fondurulia et al. |
| 8,309,173 B2 | 11/2012 | Tuominen et al. |
| 8,986,456 B2 | 3/2015 | Fondurulia et al. |
| 9,004,462 B2 | 4/2015 | Gregg et al. |
| 9,034,105 B2 | 5/2015 | Chaubey et al. |
| 9,469,898 B2 | 10/2016 | Gregg et al. |
| 9,593,416 B2 | 3/2017 | Fondurulia et al. |
| 10,385,452 B2 | 8/2019 | Hendrix et al. |
| 10,392,700 B2 * | 8/2019 | Baum ................. C23C 16/4483 |
| 10,465,286 B2 | 11/2019 | Gregg et al. |
| 10,526,697 B2 | 1/2020 | Baum et al. |
| 10,876,205 B2 | 12/2020 | Verghese et al. |
| 10,895,010 B2 | 1/2021 | Cleary et al. |
| 2007/0087130 A1 * | 4/2007 | Arai ....................... C23C 14/246 427/457 |
| 2008/0085226 A1 * | 4/2008 | Fondurulia ......... C23C 16/4401 422/198 |
| 2008/0128094 A1 * | 6/2008 | Fukuda ................. C23C 14/246 159/7 |

(Continued)

*Primary Examiner* — Aiden Lee
(74) *Attorney, Agent, or Firm* — MOSER TABOA (57) ABSTRACT

Embodiments of a solid chemical delivery system having a refillable sublimation vessel are provided herein. In some embodiments, a solid chemical delivery system includes: a refillable sublimation vessel including: a vessel body coupled to a vessel lid to define an interior volume of the refillable sublimation vessel, wherein the vessel lid includes a central refill port, a gas inlet port, and a gas outlet port; a flow restricting structure disposed in an upper portion of the interior volume; and a vertical appendage disposed in the interior volume and extending from a bottom plate of the vessel body; a refill cartridge removably coupled to the central refill port of the refillable sublimation vessel and having an internal volume therein; and a first valve disposed between the refillable sublimation vessel and the refill cartridge.

16 Claims, 6 Drawing Sheets

(56) References Cited

U.S. PATENT DOCUMENTS

| | | | |
|---|---|---|---|
| 2008/0143002 A1* | 6/2008 | Steidl | C23C 16/448 |
| | | | 261/122.1 |
| 2012/0240858 A1* | 9/2012 | Taniyama | C30B 23/066 |
| | | | 118/726 |
| 2013/0019960 A1* | 1/2013 | Choi | C23C 16/4408 |
| | | | 137/627 |
| 2014/0026977 A1 | 1/2014 | Kimmerle et al. | |
| 2014/0029374 A1 | 1/2014 | Kimmerle et al. | |
| 2014/0041590 A1* | 2/2014 | Jang | C23C 16/4481 |
| | | | 118/726 |
| 2015/0053134 A1* | 2/2015 | Lee | C23C 16/45512 |
| | | | 366/101 |
| 2015/0299858 A1* | 10/2015 | Yudovsky | C23C 16/4481 |
| | | | 427/255.28 |
| 2016/0017489 A1* | 1/2016 | Koller | C23C 16/4482 |
| | | | 261/153 |
| 2019/0032206 A1 | 1/2019 | Hodges et al. | |
| 2020/0056283 A1 | 2/2020 | Shero et al. | |

* cited by examiner

REFILLABLE LARGE VOLUME SOLID PRECURSOR SUBLIMATION VESSEL

FIELD

Embodiments of the present disclosure generally relate to substrate processing equipment.

BACKGROUND

Substrate processing equipment may include solid chemical delivery systems to provide one or more process gases to a process chamber, for example, a chemical vapor deposition (CVD) chamber, an atomic layer deposition (ALD) chamber, an etch chamber, or the like, for performing a suitable chemical process. Solid chemical delivery systems typically include a sublimation vessel that contains a solid precursor. A carrier gas may be flowed through the sublimation vessel to sublime the solid precursor to form the one or more process gases to be delivery to the process chamber. However, a carrier gas having low residence time within the sublimation vessel provides lower saturation of sublimed material in the carrier gas stream, decreasing the partial pressure of the one or more process gases provided to the process chamber.

Further, once the solid precursor is depleted from the sublimation vessel, the sublimation vessel typically needs to be cooled, removed from the processing tool, and returned to a chemical supplier to be refilled, resulting in tool downtime. Alternatively, some solid chemical delivery systems may rely on extremely large sublimation vessels located off of the processing tool. However, these extremely large sublimation vessels are expensive and require a long length of heated delivery lines which are expensive, complex, and hard to control.

Accordingly, the inventors have provided improved solid chemical delivery systems and improved sublimation vessels for subliming solid state precursors.

SUMMARY

Embodiments of a solid chemical delivery system having a refillable sublimation vessel are provided herein. In some embodiments, a solid chemical delivery system includes: a refillable sublimation vessel including: a vessel body coupled to a vessel lid to define an interior volume of the refillable sublimation vessel, wherein the vessel lid includes a central refill port, a gas inlet port, and a gas outlet port; a flow restricting structure disposed in an upper portion of the interior volume; and a vertical appendage disposed in the interior volume and extending from a bottom plate of the vessel body; a refill cartridge removably coupled to the central refill port of the refillable sublimation vessel and having an internal volume therein; and a first valve disposed between the refillable sublimation vessel and the refill cartridge.

In some embodiments, a refillable sublimation vessel for use with a process chamber includes: a vessel body coupled to a vessel lid to define an interior volume of the refillable sublimation vessel, wherein the vessel lid includes a central refill port, a gas inlet port, and a gas outlet port, and wherein the gas inlet port and the gas outlet port are disposed radially outward of the central refill port; a flow restricting structure comprising at least one of a plurality of baffles defining a tortuous flow path or a filter plate comprising filter media disposed in an upper portion of the interior volume; and a vertical appendage disposed in the interior volume and extending from a bottom plate of the vessel body.

In some embodiments, a refillable sublimation vessel for use with a process chamber includes: a vessel body coupled to a vessel lid to define an interior volume of the refillable sublimation vessel, wherein the vessel lid includes a central refill port, a gas inlet port, and a gas outlet port; a flow restricting structure comprising at least one of a plurality of baffles defining a tortuous flow path or a filter plate comprising filter media disposed in an upper portion of the interior volume; a vertical appendage disposed in the interior volume and extending from a bottom plate of the vessel body; a plurality of horizontal members extending radially outward from the vertical appendage; and one or more heaters coupled to at least one of sidewalls of the vessel body, the vessel lid, or the bottom plate of the vessel body.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a solid chemical delivery system are provided herein. The solid chemical delivery system includes a refillable sublimation vessel that is partially filled with a solid-state precursor. The refillable sublimation vessel advantageously is configured to interface with a chemical refill cartridge in close proximity to the refillable sublimation vessel to reduce long heated delivery lines. When the solid-state precursor is depleted in the refillable sublimation vessel to a threshold amount, the refillable sublimation vessel, or ampoule, can be refilled in place without needing to be cooled, advantageously reducing tool downtime. The refillable sublimation vessel advantageously allows for a smaller volume and less expensive vessel be used for solid chemical delivery. Once the chemical refill cartridge is depleted, the chemical refill cartridge may be exchanged with another chemical refill cartridge that is filled with the solid-state precursor. The solid-state precursor may comprise and suitable material to form a gaseous precursor to perform a desired process. For example, the gaseous precursor may be a halide containing gas.

The solid chemical delivery system may be a delivery system for semiconductor substrate process chambers, for example, deposition chambers, etching chambers, cleaning chamber, or the like. When a carrier gas is flowed through the refillable sublimation vessel, the carrier gas sublimes the solid-state precursor into a sublimed precursor, resulting in a gaseous mixture of the sublimed precursor and the carrier gas. The refillable sublimation vessel is heated in order to sublime the solid-state precursor. The refillable sublimation vessel also includes a flow restricting structure to increase a residence time of the carrier gas flowed therethrough advantageously enhancing mixing of the carrier gas and the sublimed precursor.

Figure 1:
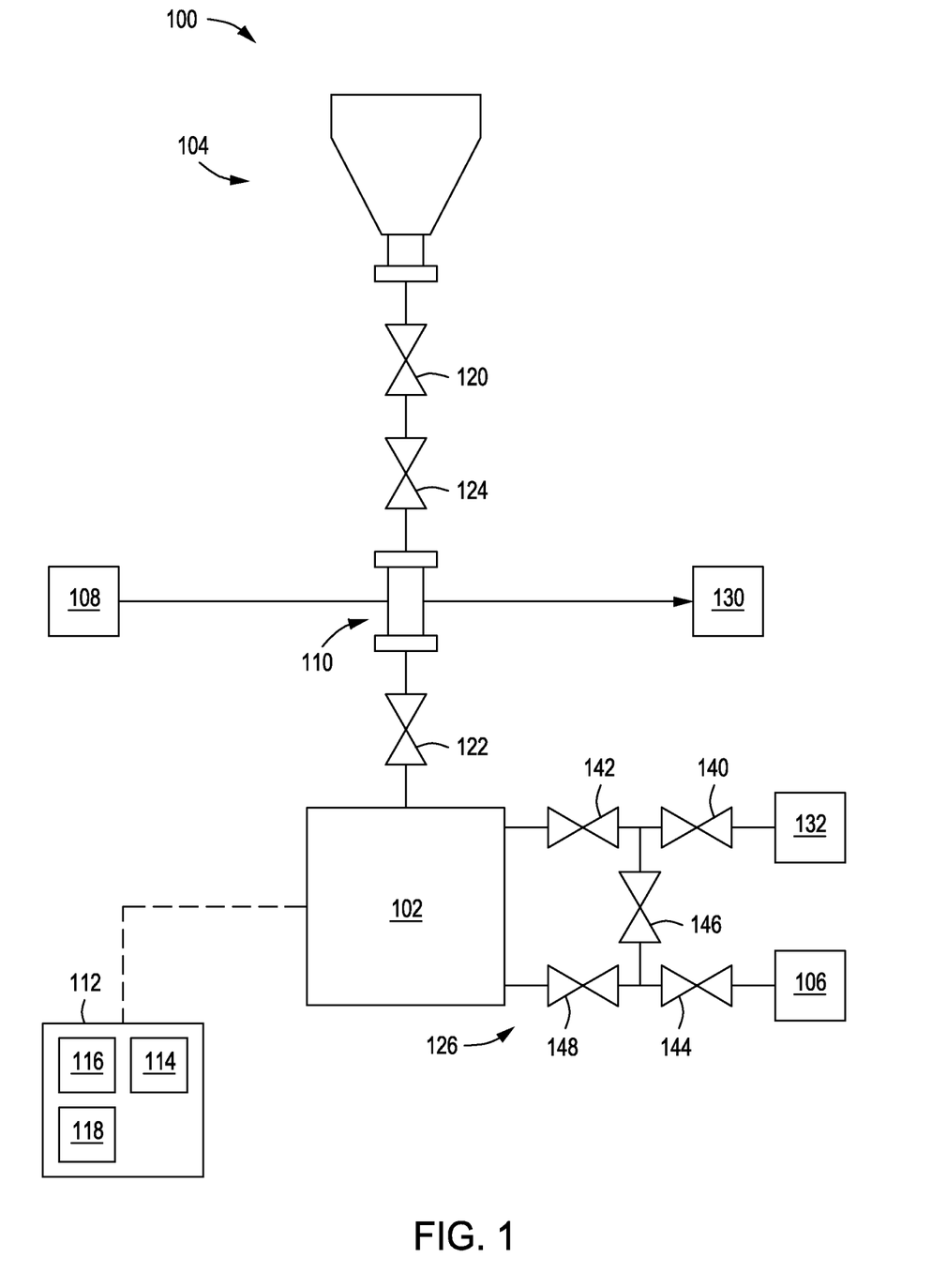
FIG. 1 depicts a schematic view of a solid chemical delivery system in accordance with some embodiments of the present disclosure.

FIG. 1 depicts a schematic view of a solid chemical delivery system in accordance with some embodiments of the present disclosure. The solid chemical delivery system 100 includes a refillable sublimation vessel 102. A refill cartridge 104 is removably coupled to the refillable sublimation vessel 102. In some embodiments, a first valve 120 is disposed between the refillable sublimation vessel 102 and the refill cartridge 104. In some embodiments, the refillable sublimation vessel 102 has an internal volume of about 3.0 liters to about 7.0 liters. In some embodiments, the refill cartridge 104 has an internal volume of about 3.0 liters to about 7.0 liters. In some embodiments, the refill cartridge 104 has an internal volume less than an internal volume of the refillable sublimation vessel 102. In some embodiments, the refill cartridge 104 is disposed above the refillable sublimation vessel 102. In some embodiments, the solid chemical delivery system 100, from a top of the refill cartridge 104 to a bottom of the refillable sublimation vessel 102 is about 3.0 feet to about 6.0 feet tall.

In some embodiments, a spool 110 is disposed in-line between the refillable sublimation vessel 102 and the refill cartridge 104 and is configured to provide a cross-flow of a purge gas from a purge gas supply 108 to vacuum 130. In some embodiments, prior to the refill cartridge 104 being separated from the refillable sublimation vessel 102, the spool 110 may be purged via the purge gas supply 108 to remove any unwanted solid precursor material therein. In some embodiments, the spool 110 is disposed in-line between the refillable sublimation vessel 102 and the first valve 120. In some embodiments, the purge gas is an inert gas such as nitrogen ($N_2$), helium (He), argon (Ar), or the like. In some embodiments, a second valve 122 is disposed between the spool 110 and the refillable sublimation vessel 102. In some embodiments, a third valve 124 is disposed between the spool 110 and the second valve 122. In some embodiments, the third valve 124 is a manual valve and the first valve 120 and the second valve 122 are both pneumatic valves.

When the refillable sublimation vessel 102 is determined to be close to empty, a refill may be requested via a controller 112. The controller 112 may control the operation of the solid chemical delivery system 100 using a direct control of any of the valves described herein. The controller 112 generally includes a central processing unit (CPU) 114, a memory 116, and a support circuit 118. The CPU 114 may be one of any form of a general-purpose computer processor that can be used in an industrial setting. The support circuit 118 is conventionally coupled to the CPU 114 and may comprise a cache, clock circuits, input/output subsystems, power supplies, and the like. Software routines, such as processing methods may be stored in the memory 116 and, when executed by the CPU 114, transform the CPU 114 into a specific purpose computer (controller 112).

In operation, the controller 112 enables data collection and feedback from any sensors that detect when at least one of the refillable sublimation vessel 102 or the refill cartridge 104 need to be refilled. For example, the memory 116 can be a non-transitory computer readable storage medium having instructions that when executed by the CPU 114 (or controller 112) control the solid chemical delivery system 100 using the apparatus provided herein.

In some embodiments, the controller 112 may open at least one of the first valve 120 or the second valve 122 to accept solid-state precursor delivery from the refill cartridge 104 to the refillable sublimation vessel 102. In some embodiments, the refillable sublimation vessel 102 remains hot while being refilled, advantageously avoiding considerable downtime that would otherwise be need to cool down and reheat the refillable sublimation vessel 102. In some embodiments, when the refill cartridge 104 is depleted, the refill cartridge 104, the first valve 120, and the third valve 124 may be removably coupled from the spool 110 to resupply the refill cartridge 104 with additional solid-state precursor.

A carrier gas supply 132 is fluidly coupled to the refillable sublimation vessel 102 via a gas inlet port 136 to provide a carrier gas therein. The refillable sublimation vessel 102 includes a gas outlet port 138 that fluidly couples the refillable sublimation vessel 102 to a process chamber 106 for delivering a mixture of the carrier gas and sublimed precursor to the process chamber 106. The carrier gas may be any gas suitable to perform a desired process. In some embodiments, the carrier gas may be an inert gas such as nitrogen gas ($N_2$), or the like. In some embodiments, the carrier gas may be a reactive gas, such as a hydrogen gas ($H_2$).

The refillable sublimation vessel 102 includes a plurality of vessel control valves 126 for delivering the carrier gas from the carrier gas supply 132 and for delivering the gaseous precursor (i.e., mixture of carrier gas and sublimed solid-state precursor). In some embodiments, the plurality of vessel control valves 126 include an inlet valve 140 and a first isolation valve 142 for controlling the flow of carrier gas to the refillable sublimation vessel 102. In some embodiments, the plurality of vessel control valves 126 include an outlet valve 144 and a second isolation valve 148 for controlling a flow of a gaseous precursor to the process chamber 106. In some embodiments, the plurality of vessel control valves 126 include a bypass valve 146 for flowing the carrier gas from the carrier gas supply 132 to the process chamber 106 without flowing through the refillable sublimation vessel 102. The controller 112 may control one or more of the vessel control valves 126

Figure 2:
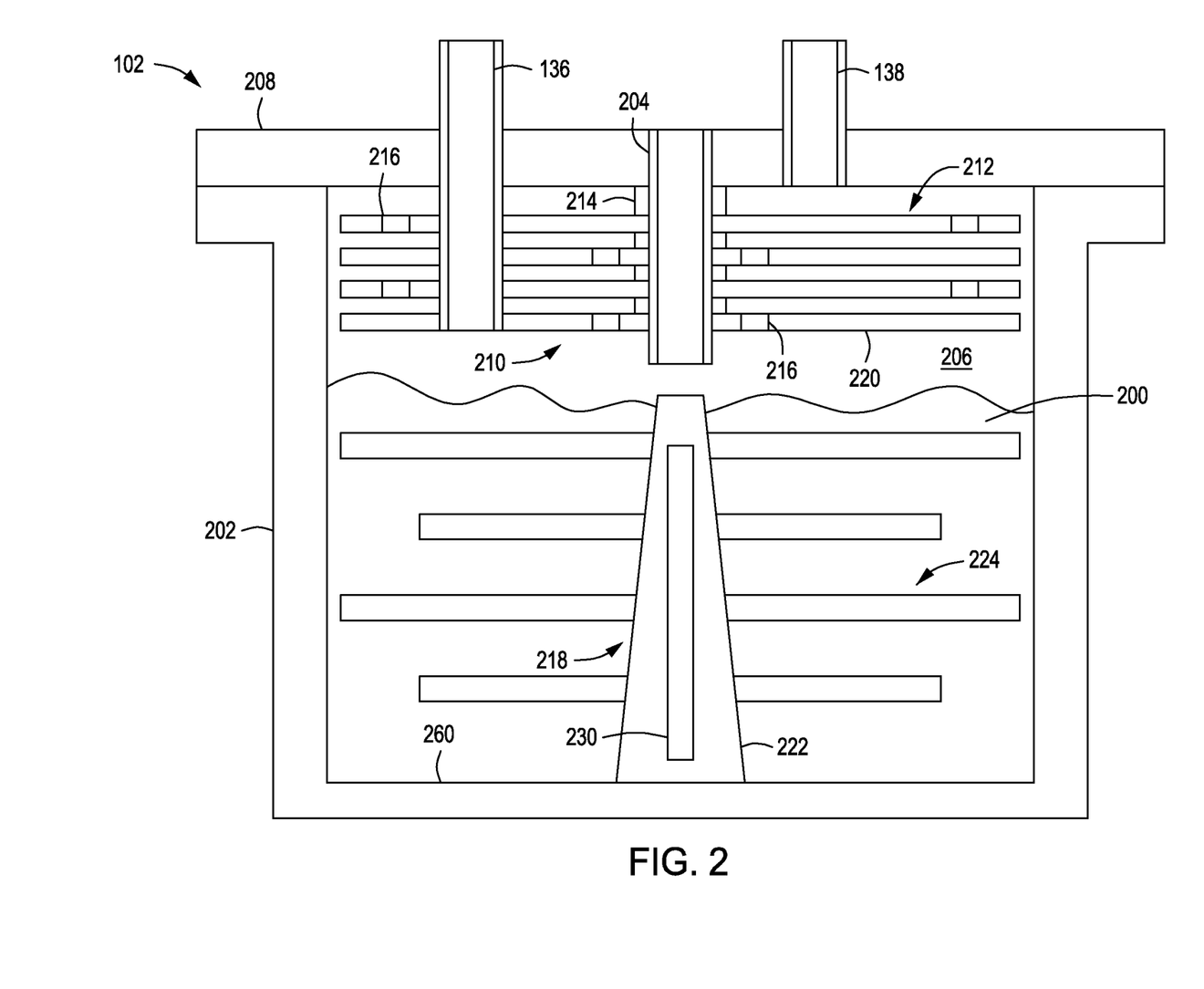
FIG. 2 depicts a schematic side view of a refillable sublimation vessel in accordance with some embodiments of the present disclosure.

FIG. 2 depicts a schematic side view of a refillable sublimation vessel in accordance with some embodiments of the present disclosure. In some embodiments, the refillable sublimation vessel 102 includes a vessel body 202 coupled to a vessel lid 208 to define an interior volume 206 of the refillable sublimation vessel 102. In some embodiments, the vessel lid 208 includes a central refill port 204 for refilling the refillable sublimation vessel 102 via the refill cartridge 104. In some embodiments, the central refill port 204 extends through the vessel lid 208 and into the interior volume 206. In some embodiments, the vessel lid 208 includes the gas inlet port 136 and the gas outlet port 138.

In some embodiments, the gas inlet port 136 and the gas outlet port 138 are disposed radially outward of the central refill port 204. In some embodiments, the central refill port 204 is about 0.5 inches to about 2.0 inches in diameter. In some embodiments, the vessel lid 208 is removable coupled to the vessel body 202 for ease of cleaning and refill. In some embodiments, the gas inlet port 136 is disposed further from the central refill port 204 than the gas outlet port 138.

In some embodiments, the refillable sublimation vessel 102 is made of any suitable material that is non-reactive with the solid state or gaseous precursor disposed in an interior volume. In some embodiments, the refillable sublimation vessel is made of a metal, such as stainless steel. The refillable sublimation vessel 102 and associated control valves are heated to the necessary temperature such that the solid chemical sublimes into a sub-atmospheric internal volume of the refillable sublimation vessel 102.

In some embodiments, a flow restricting structure 210 is disposed in the interior volume 206. In some embodiments, the flow restricting structure 210 comprises a plurality of baffles 212 defining a tortuous flow path from the gas inlet port 136 to the gas outlet port 138. The tortuous flow path advantageously increases a residence time of the carrier gas in the interior volume to enhance mixing of the carrier gas and the sublimed precursor. In some embodiments, the plurality of baffles 212 comprise a plurality of stacked plates 220 that are vertically spaced apart. In some embodiments, the plurality of stacked plates 220 are separated by spacers 214 disposed about the central refill port 204. In some embodiments, the plurality of baffles 212 are coupled to the vessel lid 208 and may be removed from the vessel body 202 for ease of cleaning and replacement. In some embodiments, the central refill port 204 extends downward into the interior volume 206 beyond the plurality of baffles 212.

In some embodiments, each stacked plate of the plurality of stacked plates 220 includes one or more openings 216 to provide a flow path that extends from the gas inlet port 136 through the one or more openings 216 and to the gas outlet port 138. In some embodiments, the central refill port 204 extends through the plurality of stacked plates 220. In some embodiments, the gas inlet port 136 extends through the plurality of stacked plates 220 and the gas outlet port 138 does not extend through the plurality of stacked plates 220. In some embodiments, the gas inlet port 136 does not extend through the plurality of stacked plates 220 and the gas outlet port 138 extends through the plurality of stacked plates 220. In some embodiments, the one or more openings 216 extend through a stacked plate of the plurality of stacked plates 220 radially inward of a location of the gas inlet port 136 and the one or more openings 216 of an adjacent stacked plate of the plurality of stacked plates 220 are disposed radially outward of the location of the gas inlet port 136.

The refillable sublimation vessel 102 includes one or more appendages 218 to better distribute a solid-state precursor 200 in the interior volume 206. In some embodiments, the one or more appendages 218 advantageously distribute heat into solid-state precursor 200. In some embodiments, the one or more appendages 218 include a vertical appendage 222. In some embodiments, the vertical appendage 222 extends from a bottom plate 260 of the vessel body 202. In some embodiments, the vertical appendage 222 tapers downward and radially outward to the bottom plate 260. In some embodiments, a central heater 230 is disposed in the vertical appendage 222. The vertical appendage 222 is spaced from the flow restricting structure 210.

In some embodiments, the one or more appendages 218 include one or more horizontal appendages 224 extending radially outward from the vertical appendage 222 to further distribute the solid-state precursor 200 more uniformly in the interior volume 206. The one or more horizontal appendages 224 can have any suitable geometry. In some embodiments, the one or more horizontal appendages 224 are elongate members with a circular cross-section. For example, in some embodiments, each of the one or more appendages 224 can be arms or bars, such as for example, rods, that extend radially from the vertical appendage 222. In some embodiments, the one or more appendages 224 extend radially from the vertical appendage 222 and do not contact the body 202 (e.g., the one or more appendages 224 are cantilevered from the vertical appendage 222).

In some embodiments, each horizontal appendage of the one or more horizontal appendages 224 is not aligned with at least one other horizontal appendage of the one or more horizontal appendages 224. In some embodiments, the one or more horizontal appendages 224 are clocked at various angles about the vertical appendage 222. For example, in some embodiments, the one or more horizontal appendages 224 may include a plurality of horizontal appendages 224 arranged in a plurality of planar sets. In some embodiments, the horizontal appendages 224 within each planar set may be equidistantly spaced with respect to each other. In some embodiments, the horizontal appendages 224 within a given planar set may be angularly offset with respect to the horizontal appendages 224 within an adjacent planar set.

Figure 3:
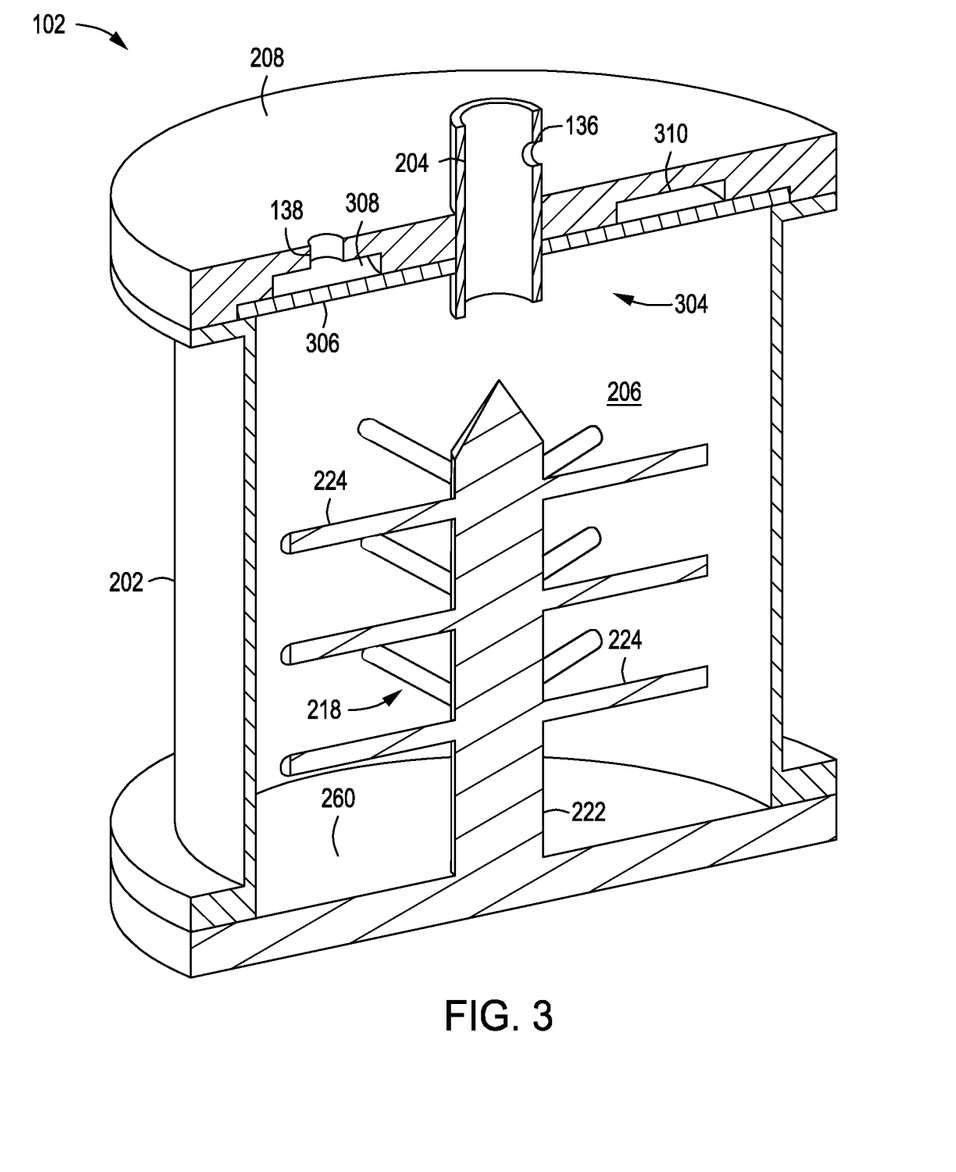
FIG. 3 depicts an isometric cross-sectional view of a refillable sublimation vessel in accordance with some embodiments of the present disclosure.

FIG. 3 depicts an isometric cross-sectional view of a refillable sublimation vessel in accordance with some embodiments of the present disclosure. In some embodiments, the flow restricting structure 210 comprises a filter plate 306 comprising filter media disposed in an upper portion 304 of the interior volume 206. The filter media increases a residence time of the carrier gas in the interior volume 206 to enhance mixing between the sublimed precursor and the carrier gas. In some embodiments, the filter media comprises a sintered metal having a porosity of about 3.0 nanometers to about 200.0 nanometers. In some embodiments, the central refill port 204 extends downward into the interior volume 206 beyond the filter plate 306.

In some embodiments, an annular plenum 308 is disposed between the filter plate 306 and the gas outlet port 138. In some embodiments, the vessel lid 208 includes an annular groove 310 to define the annular plenum 308. In some embodiments, the gas inlet port 136 extends into the central refill port 204. In some embodiments, a gas flow path extends from the gas inlet port 136 through a portion of the central refill port 204 and into the interior volume 206 and from the interior volume 206 through the filter plate 306, through the annular plenum 308, and to the gas outlet port 138.

Figure 4:
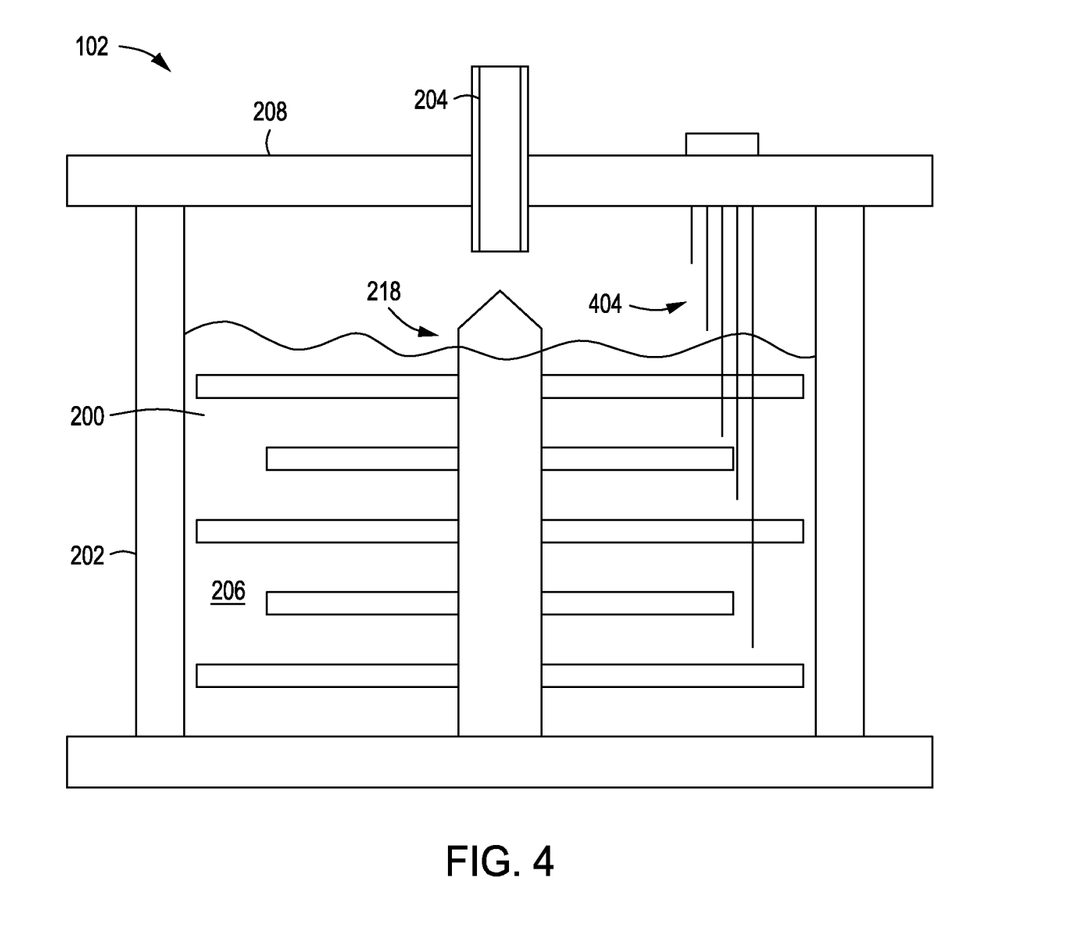
FIG. 4 depicts schematic side view of a refillable sublimation vessel in accordance with some embodiments of the present disclosure.

FIG. 4 depicts schematic side view of a refillable sublimation vessel in accordance with some embodiments of the present disclosure. In some embodiments, a plurality of thermal sensors 404 are disposed in the interior volume 206 at different heights. The different heights of the thermal sensors of the plurality of thermal sensors 404 advantageously may provide a measurement of a level of the solid-state precursor 200. The plurality of thermal sensors 404 may also be used to determine if the refillable sublimation vessel 102 has been successfully refilled with refill cartridge 104.

Figure 5:
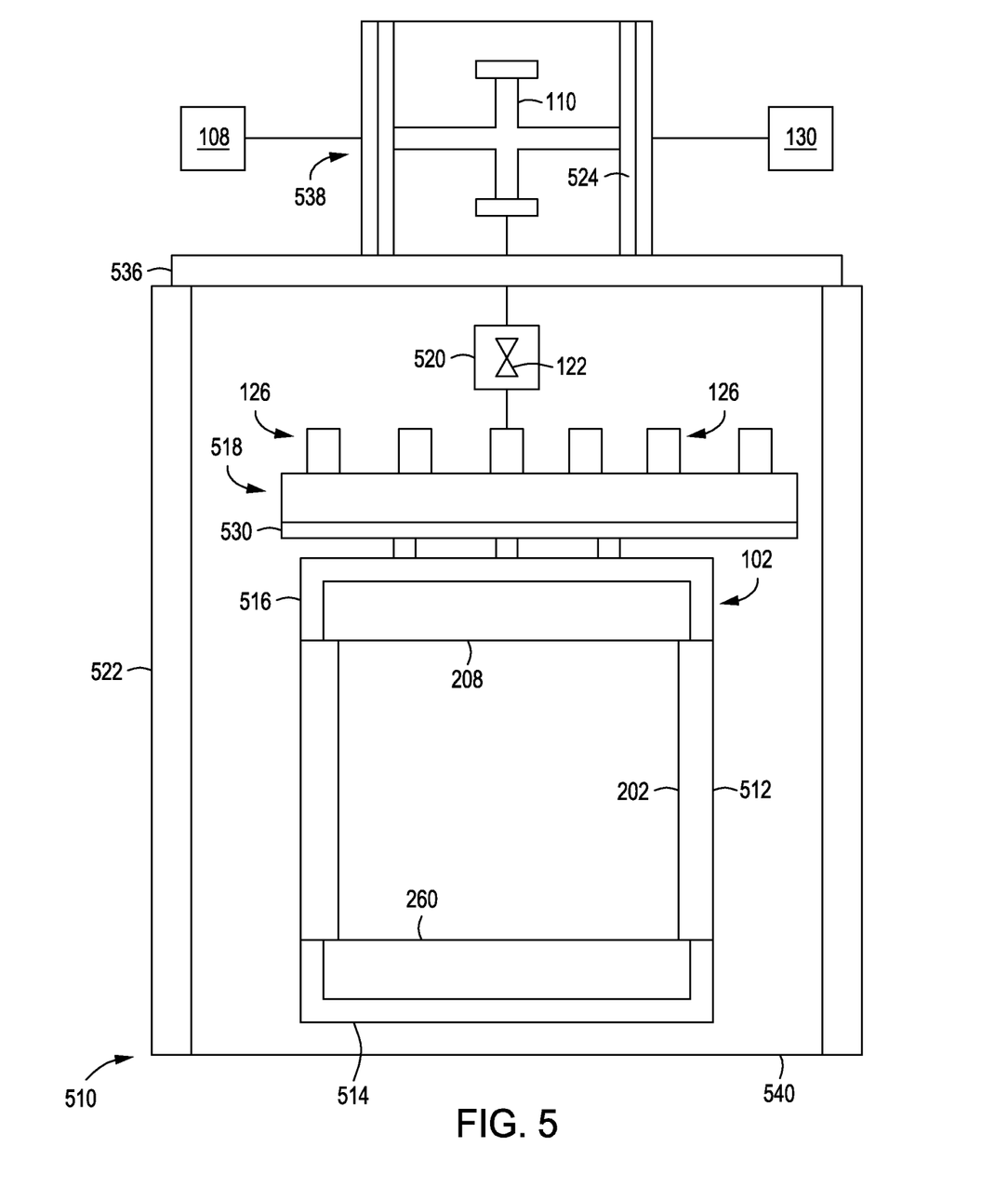
FIG. 5 depicts thermal zones of a portion of the solid chemical delivery system in accordance with some embodiments of the present disclosure.

FIG. 5 depicts thermal zones of a portion of the solid chemical delivery system in accordance with some embodiments of the present disclosure. In some embodiments, components of the solid chemical delivery system 100 may be heated to a suitable temperature to perform a desired process. The solid chemical delivery system 100 may include one or more heaters 510. In some embodiments, the one or more heaters 510 comprise heated fire rods, a heater jacket, one or more resistive heating elements, or the like. A temperature of each heater of the one or more heaters 510 may be controlled independently to form one or more respective heating zones. For example, the one or more heaters 510 may include a first heater 512 disposed about or coupled to sidewalls of the vessel body 202 to heat the vessel body 202. In some embodiments, the one or more heaters 510 include a second heater 514 coupled to the bottom plate 260 of the vessel body 202 to heat the bottom plate 260. In some embodiments, the one or more heaters 510 include a third heater 516 coupled to the vessel lid 208 to heat the vessel lid 208.

In some embodiments, the plurality of vessel control valves 126 are coupled to a valve heating plate 530. In some embodiments, the one or more heaters 510 include a fourth heater 518 thermally coupled to or embedded in the valve heating plate 530. In some embodiments, the one or more heaters 510 include a fifth heater 520 thermally coupled to the second valve 122. In some embodiments, the refillable sublimation vessel 102 is disposed in an enclosure 540. In some embodiments, the one or more heaters 510 includes a sixth heater 522 thermally coupled to the enclosure 540 to heat the enclosure 540. In some embodiments, the sixth heater 522 is disposed about sidewalls of the enclosure 540. In some embodiments, the plurality of vessel control valves 126 and the second valve 122 are disposed in the enclosure 540.

In some embodiments, the one or more heaters 510 include a seventh heater 524 to heat the spool 110. In some embodiments, a thermal isolation layer 536 is disposed between the fifth heater 520 and the seventh heater 524 to thermally isolate the spool 110 from the refillable sublimation vessel 102. In some embodiments, the spool 110 is enclosed within a water-cooled heat sink 538 to cool the spool 110. The spool 110 may be selectively heated or cooled when coupling or decoupling the refill cartridge 104 from the refillable sublimation vessel 102. For example, when the precursor is being formed, the spool 110 may be heated. Prior to the refill cartridge 104 being separated from the spool 110, the spool 110 may be cooled to facilitate handling of the refill cartridge 104.

Figure 6:
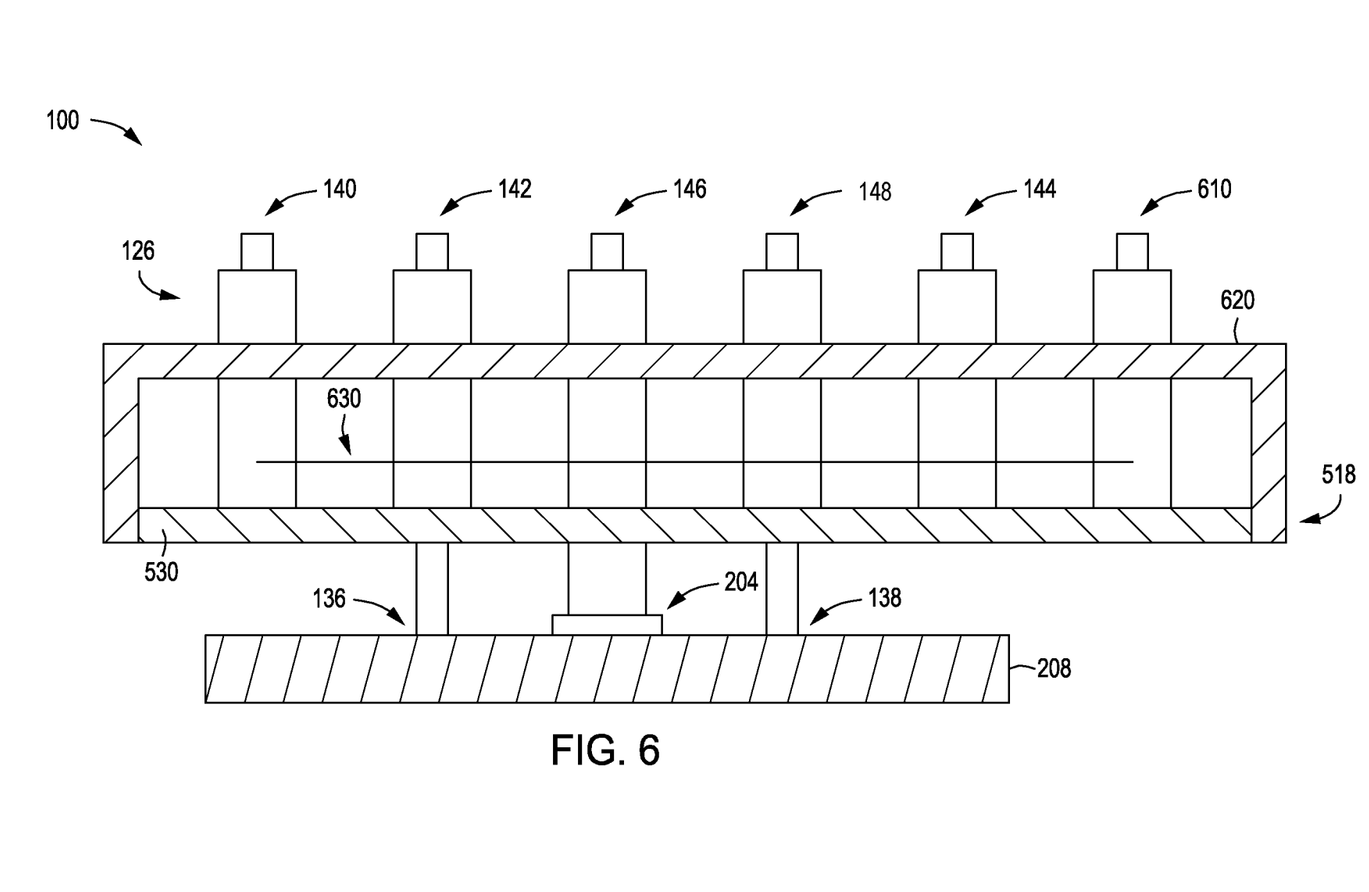
FIG. 6 depicts a schematic cross-sectional side view of a portion of the solid chemical delivery system in accordance with some embodiments of the present disclosure.

FIG. 6 depicts a schematic cross-sectional side view of a portion of the solid chemical delivery system in accordance with some embodiments of the present disclosure. In some embodiments, the plurality of vessel control valves 126 are coupled to the vessel lid 208 outside of the interior volume 206. The plurality of vessel control valves 126 are disposed about the refill port 204. In some embodiments, the refill port 204 may extend through a central portion of the valve heating plate 530 while the bypass valve 146 is disposed in a peripheral portion of the valve heating plate 530. In some embodiments, the plurality of vessel control valves 126 are mounted to the valve heating plate 530. In some embodiments, a clamshell 620 may enclose at least a portion of the plurality of vessel control valves 126. The clamshell 620 is coupled to the valve heating plate 530 and facilitates more uniform heating of the plurality of vessel control valves and associated transfer lines 630 (i.e., transfer lines that fluidly couple the plurality of vessel control valves 126 in an arrangement as shown in FIG. 1) and reduces heat loss therefrom. For example, the associated transfer lines 630 include transfer lines that deliver carrier gas from the carrier gas supply 132 to the inlet valve 140, from the inlet valve 140 to the first isolation valve 142, and from the first isolation valve 142 to the inlet port 136. The associated transfer lines 630 may also include transfer lines that extend from the outlet port 138 to deliver a gaseous precursor from the outlet port 138 to the second isolation valve 148 and from the second isolation valve 148 to the outlet valve 144. In some embodiments, associated transfer lines 630 includes transfer lines that extend from the inlet valve 140 to the bypass valve 146 and from the bypass valve 146 to the outlet valve 144. In some embodiments, a vacuum valve 610 is fluidly coupled to the plurality of vessel control valves 126 via one of the associated transfer lines 603. The vacuum valve 610 is coupled to vacuum 130 and configured to selectively evacuate the associated transfer lines 630. In some embodiments, the vacuum valve 610 is fluidly coupled downstream of the refillable sublimation vessel 102. The vacuum valve 610 may be fluidly coupled downstream of the second isolation valve 148.

In some embodiments, the clamshell 620 may fully enclose the plurality of vessel control valves 126 and associated transfer lines 630. In some embodiments, the plurality of vessel control valves 126 are positioned along a common plate (e.g., heating plate 530) to provide more uniform heating to the plurality of vessel control valves 126 via the third heater 516. In some embodiments, the third heater 516 includes heating elements disposed both below and above the plurality of vessel control valves 126.

While the foregoing is directed to embodiments of the present disclosure, other and further embodiments of the disclosure may be devised without departing from the basic scope thereof.

The invention claimed is:

1. A solid chemical delivery system, comprising:
   a refillable sublimation vessel including:
      a vessel body coupled to a vessel lid to define an interior volume of the refillable sublimation vessel, wherein the vessel lid includes a central refill port, a gas inlet port, and a gas outlet port;
      a flow restricting structure disposed in an upper portion of the interior volume; and
      a vertical appendage disposed in the interior volume and extending from a bottom plate of the vessel body;
   a refill cartridge disposed above the vessel body and removably coupled to the central refill port of the refillable sublimation vessel and having an internal volume therein;
   a first valve disposed between the refillable sublimation vessel and the refill cartridge;
   a spool disposed in-line between the refillable sublimation vessel and the first valve, wherein at least one of: the spool is enclosed within a heat sink to cool the spool, or a heater is disposed about the spool;
   a second valve disposed between the spool and the refillable sublimation vessel;
   a heater thermally coupled to the second valve; and
   a thermal isolation layer disposed between the spool and the second valve.

2. The solid chemical delivery system of claim 1, wherein the flow restricting structure comprises a plurality of baffles defining a tortuous flow path, and wherein the plurality of baffles comprise a plurality of stacked plates that are vertically spaced apart via spacers disposed therebetween.

3. The solid chemical delivery system of claim 1, wherein the spool is configured to flow a cross-flow of a purge gas.

4. The solid chemical delivery system of claim 1, further comprising a third valve disposed between the spool and the first valve, wherein the third valve is a manual valve and the first valve and the second valve are both pneumatic valves.

5. A refillable sublimation vessel for use with a process chamber, comprising:
- a vessel body coupled to a vessel lid to define an interior volume of the refillable sublimation vessel, wherein the vessel lid includes a central refill port, a gas inlet port, and a gas outlet port, and wherein the gas outlet port is disposed radially outward of the central refill port;
- a flow restricting structure disposed in an upper portion of the interior volume comprising a plurality of baffles directly coupled to the central refill port; and
- a vertical appendage disposed in the interior volume and extending from a bottom plate of the vessel body, wherein the vertical appendage is spaced from the flow restricting structure, wherein the central refill port extends downward into the interior volume beyond the flow restricting structure and vertically above an upper surface of the vertical appendage.

6. The refillable sublimation vessel of claim 5, wherein at least one of the gas inlet port or the gas outlet port extends through the plurality of baffles, and wherein the central refill port extends downward beyond the gas inlet port and the gas outlet port.

7. The refillable sublimation vessel of claim 5, further comprising a plurality of horizontal members extending radially outward from the vertical appendage, wherein each horizontal member of the plurality of horizontal members is not aligned with at least one other horizontal member of the plurality of horizontal members.

8. The refillable sublimation vessel of claim 5, wherein the vertical appendage includes a heater.

9. The refillable sublimation vessel of claim 5, further comprising a plurality of thermal sensors disposed in the interior volume at different heights.

10. The refillable sublimation vessel of claim 5, wherein the plurality of baffles define a tortuous flow path and comprise a plurality of stacked plates that are vertically spaced apart, wherein each stacked plate of the plurality of stacked plates includes one or more openings therethrough to provide a flow path that extends from the gas inlet port through the one or more openings and to the gas outlet port.

11. The refillable sublimation vessel of claim 10, wherein the one or more openings extend through a stacked plate of the plurality of stacked plates radially inward of a location of the gas inlet port and the one or more openings of an adjacent stacked plate of the plurality of stacked plates are disposed radially outward of the location of the gas inlet port.

12. The refillable sublimation vessel of claim 10, wherein the plurality of baffles are coupled to the vessel lid and spaced from sidewalls of the vessel body.

13. A refillable sublimation vessel for use with a process chamber, comprising:
- a vessel body coupled to a vessel lid to define an interior volume of the refillable sublimation vessel, wherein the vessel lid includes a central refill port, a gas inlet port, and a gas outlet port;
- a flow restricting structure disposed in an upper portion of the interior volume;
- a vertical appendage disposed in the interior volume and extending from a bottom plate of the vessel body, wherein the vertical appendage tapers downward and radially outward;
- a plurality of horizontal members extending radially outward from the vertical appendage, wherein each horizontal member of the plurality of horizontal members is an elongate member that not aligned with at least one other horizontal member of the plurality of horizontal members; and
- one or more heaters coupled to at least one of sidewalls of the vessel body, the vessel lid, or the bottom plate of the vessel body.

14. The refillable sublimation vessel of claim 13, further comprising a central heater disposed in the vertical appendage.

15. The refillable sublimation vessel of claim 13, further comprising a plurality of vessel control valves coupled to the vessel lid outside of the interior volume, wherein the plurality of vessel control valves are mounted to a valve heating plate.

16. The refillable sublimation vessel of claim 13, wherein the one or more heaters comprise heated fire rods, a heater jacket, or one or more resistive heating elements.

* * * * *